United States Patent
Stahl et al.

(10) Patent No.: US 7,245,499 B2
(45) Date of Patent: Jul. 17, 2007

(54) INSERTION AND EJECTION MECHANISMS FOR MODULAR BOARDS AND CARDS

(75) Inventors: Douglas L. Stahl, Phoenix, AZ (US); Marwan Khoury, San Jose, CA (US); Ho Wang, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 39 days.

(21) Appl. No.: 10/955,374

(22) Filed: Sep. 30, 2004

(65) Prior Publication Data

US 2006/0067063 A1    Mar. 30, 2006

(51) Int. Cl.
*H05K 5/00* (2006.01)

(52) U.S. Cl. ............... 361/754; 361/759; 361/610; 361/732; 361/740; 361/741; 361/747; 439/368; 439/327

(58) Field of Classification Search ............... 361/728, 361/732, 736, 740, 741, 747, 748, 610, 759; 439/368, 327
See application file for complete search history.

(56) References Cited

U.S. PATENT DOCUMENTS

| 4,152,038 | A | * | 5/1979 | Inouye et al. ............ 439/153 |
| 4,694,380 | A | * | 9/1987 | Mallory et al. ........... 361/816 |
| 5,557,499 | A | * | 9/1996 | Reiter et al. ............. 361/685 |
| 5,657,204 | A | * | 8/1997 | Hunt ..................... 361/752 |
| 5,707,245 | A | * | 1/1998 | Yamamoto et al. ........ 439/160 |
| 5,751,551 | A | * | 5/1998 | Hileman et al. .......... 361/753 |
| 5,793,614 | A | * | 8/1998 | Tollbom ................. 361/732 |
| 5,810,613 | A | * | 9/1998 | Ati et al. ............... 439/157 |
| 6,015,308 | A | * | 1/2000 | Lee et al. ............... 439/155 |
| 6,113,403 | A | * | 9/2000 | Oguchi .................. 439/159 |
| 6,172,880 | B1 | * | 1/2001 | Petitpierre et al. ....... 361/801 |
| 6,195,266 | B1 | * | 2/2001 | Padgett et al. ........... 361/799 |
| 2004/0038571 | A1 | * | 2/2004 | Kabet et al. ............. 439/160 |

* cited by examiner

*Primary Examiner*—Dean A. Reichard
*Assistant Examiner*—Hoa C. Nguyen
(74) *Attorney, Agent, or Firm*—Blakely, Sokoloff, Taylor & Zafman LLP

(57) ABSTRACT

Insertion and ejection mechanisms for modular boards and cards. Mechanisms are provided for coupling the motion of insertion/ejection handles coupled to a modular board or a board carrier frame to which a board is attached. The mechanisms include a single-bar linkage, a rack and pinion-based configuration, a two-bar linkage, and a telescoping configuration. Applying an input force to one of the handles causes the board to be urged inward in a chassis slot, thus coupling the connectors on the board with mating connectors on a backplane mounted within the chassis. The input force is coupled via the various handle-coupling mechanisms to the other handle, producing a result similar to if a force was applied to both handles at the same time. In a similar manner, a board may be ejected by applying a force to a single handle to cause that handle to rotate outward. An automated retention screw insertion and extraction mechanism is also disclosed.

22 Claims, 14 Drawing Sheets

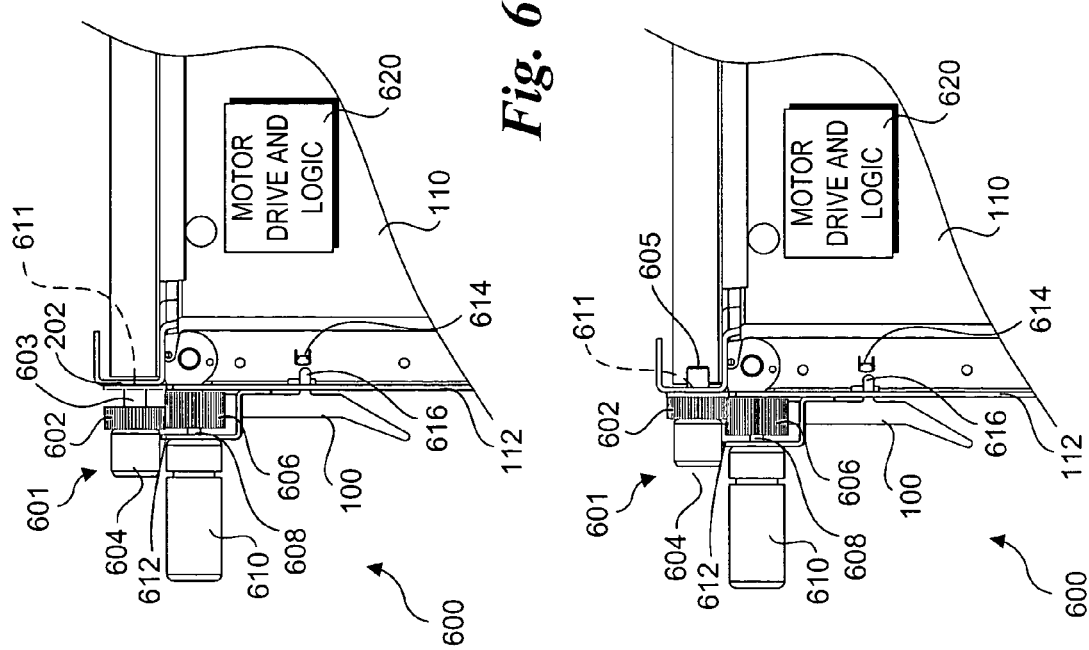

INSERTION AND EJECTION MECHANISMS FOR MODULAR BOARDS AND CARDS

FIELD OF THE INVENTION

The field of invention relates generally to computer systems and telecommunications equipment and, more specifically but not exclusively relates to an insertion and ejection mechanisms for modular boards and cards.

BACKGROUND INFORMATION

The design of modern computer system and telecommunications equipment has moved from proprietary vender-specific solutions to standardized platforms designed for expansion, flexibility, and scalability. For example, a typical telecom switch employs a chassis housing multiple modular switching boards that are connected to a backplane or midplane. Similarly, many new computer server deployments use blade servers, which include multiple server blades (cards) coupled to a backplane or midplane in a chassis. Under the standardized approach, boards and cards from different vendors can be employed in the same system with guaranteed interoperability.

In parallel with the rapid increase in processor performance observed in the past decade has been an increase in system complexity. In particular, the number and density of input/output (I/O) signals in telecom systems and blade servers have significantly increased. Furthermore, the bandwidth of the I/O signal lines is now typically specified in 100's of Megahertz or even gigahertz (GHz) levels for serial interconnect technologies such as PCI Express and Advanced Switching. This leads to very strict mechanical tolerance and alignment requirements for the connectors that are used to couple signals between a board or card and the system's backplane or midplane.

A typical expansion board or card for these types of environments employs one or more pinned connectors, each of which includes multiple rows (typically) of pins arrayed in a grid. As an option, a board/card edge connector may be used. Meanwhile, a mating connector is provided on the backplane or midplane. Upon insertion of the board/card in the chassis, the connectors are coupled.

The expansion board/card insertion process is often assisted by two means: chassis slots and insertion/ejection mechanisms. A typical chassis slot provides a pair of guide rails that is adapted to slidingly engage parallel board edges during insertion or extraction of the board. Meanwhile, the insertion function of the insertion/ejection mechanism urges the board forward so as to engage the connectors in a proper manner. Similarly, the ejection function of the insertion/ejection mechanism is used to cause the board to be disconnected from the connectors in a controller manner.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 3b is an isometric view of the handle-coupling mechanism configuration of FIG. 3a;

FIGS. 4b–d respectively show isometric views of an open, partially-closed, and closed configuration corresponding to the handle-coupling mechanism of FIG. 4a;

FIG. 5b is a rear elevation view of the handle-coupling mechanism of FIG. 5a;

FIG. 6a–d show respective positions of an automated retention screw mechanism as a board is inserted into a chassis slot;

DETAILED DESCRIPTION

Figure 1A:
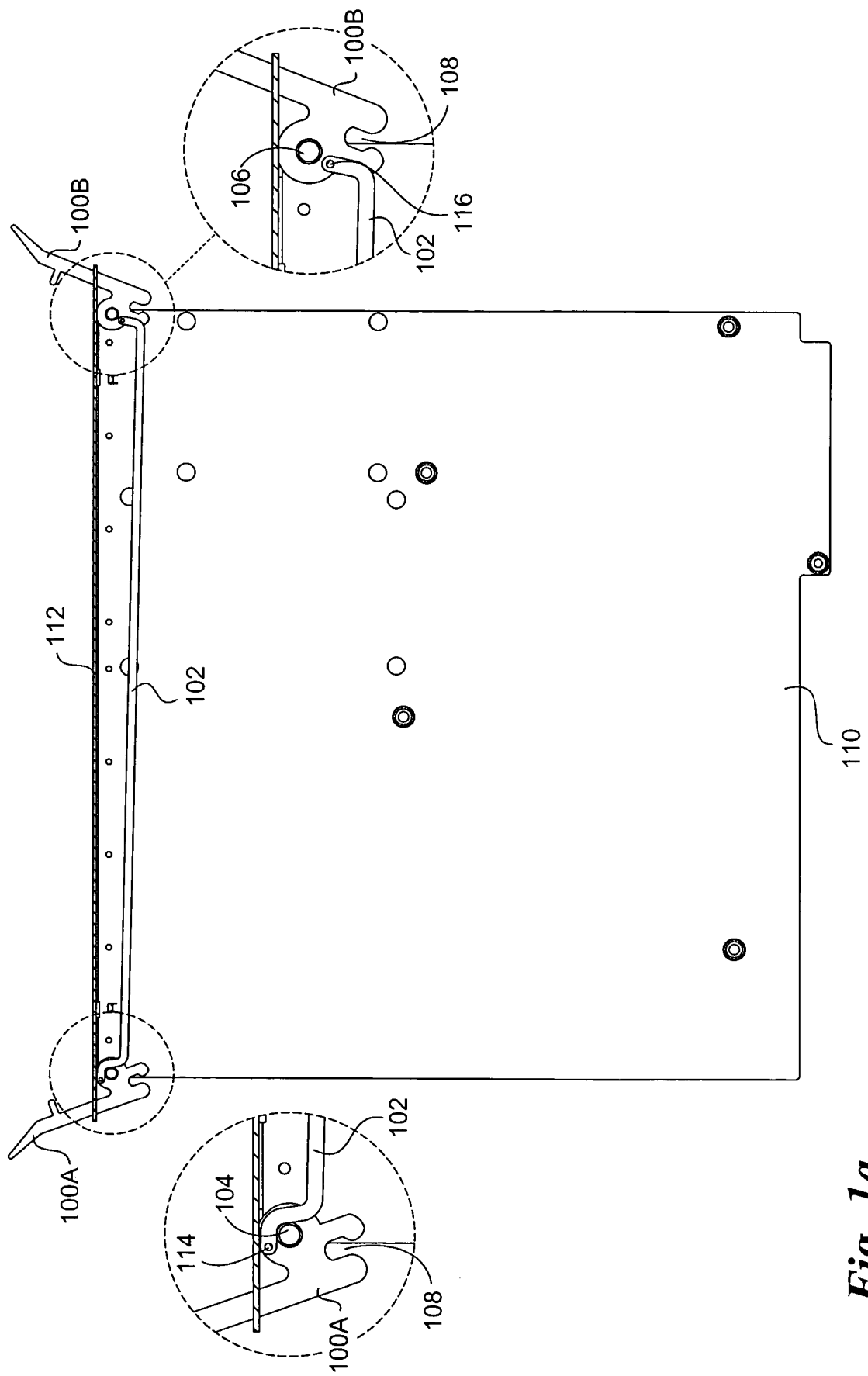
FIG. 1a is an elevation view of a handle-coupling mechanism that employs a single bar linkage.

Embodiments of modular board insertion and ejection mechanisms and corresponding methods of operation are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For illustrative purposes, embodiments of modular board insertion and ejection mechanisms that may be implemented in Advanced Telecommunications Architecture (ATCA) (also referred to as Advanced TCA) chassis are described below. However, the use of the mechanisms for the ATCA environment is merely illustrative of one modular board environment in which the principles and teachings of the embodiments of the invention described herein may be applied. In general, similar configurations may be deployed for other standardized and proprietary board insertion and ejection mechanisms.

The ATCA 3.0 base specification (approved Dec. 30, 2002), which is being carried out by the PCI Industrial Computer Manufacturers Group (PICMG), defines the physical and electrical characteristics of an off-the-shelf, modular chassis based on switch fabric connections between hot-swappable blades. This specification defines the frame (rack) and shelf (chassis) form factors, core backplane fabric connectivity, power, cooling, management interfaces, and the electromechanical specification of the ATCA-compliant boards. The electromechanical specification is based on the existing IEC60297 EuroCard form factor, and enables equipment from different vendors to be incorporated in a modular fashion with guaranteed interoperability. The ATCA 3.0 base specification also defines a power budget of 200 Watts (W) per board, enabling high performance servers with multi-processor architectures and multi gigabytes of on-board memory.

In addition to power input to ATCA boards, mating connectors on the boards and backplane are employed for coupling input/output (I/O) signals. Many of the ATCA boards, as well as other modular boards used for telecommunications and computer, such as but not limited to CompactPCI, employ very-high speed I/O channels. For example, Advanced Switching (AS) employs a serial communication channel operating at Gigahertz+ frequencies. This necessitates excellent pin coupling to support signal transmission across the connectors.

To support excellent pin coupling, the ATCA standard defines a board insertion mechanism that includes a pair of handles (a.k.a. "latches" or "levers") that are used to urge the board inward in the chassis to "drive" the pins in the connectors mounted at the rear of the board into mating receptacles in the corresponding connectors mounted on the backplane. The handles provide a lever function to enable a board to be inserted without having to supply a large amount of force to the board itself, thus reducing the chance of damaging the board. Similar mechanisms are used for other board form factors.

Notably, the handles require a two-handed operation, as well as coordination of the both hands. In view of the tight mechanical tolerances and overall configuration, force applied to a single handle may cause a board to tilt as the connectors are coupled, possibly bending connector pins. This is to be avoided.

Embodiments of the invention address this shortcoming by providing mechanisms that couple the operations of the two handles such that the motion of one handle causes the other handle to move in a similar "mirrored" manner. Thus, an input force applied to a single handle is coupled to the other handle in a manner that produces a similar effect that would result if an input force was applied to both handles at the same time. The novel mechanisms are very low in profile, allowing the mechanisms to be implemented in a manner that does not obstruct component real estate on the boards.

FIG. 1a–d shows a first embodiment of a handle-coupling mechanism. Under this configuration, a pair of handles 100A and 100B are coupled via a single-bar linkage including a link 102. Handles 100A and 100B have similar mirrored configurations, including a lever via which a force is applied to rotate the handles about respective handle pivots 104 and 106. As a handle is rotated inward, a claw-shaped clasp 108 engages a flange or the like in a card rack (e.g., ATCA chassis) in which the board is to be inserted. Further details of this engagement are discussed below with referenced to FIGS. 2a–c.

Under a typical implementation, such as is illustrated in FIGS. 1a–d, an ATCA board is mounted to a board carrier frame 110 including a front panel 112. (It is noted that the ATCA specification refers to a board carrier frame as a "front board face plate.") It is noted that the front panel 112 has been removed via a section cut in FIGS. 1a–d and 2a–c to more clearly depict how the single-bar linkage operates—front panel 112 is shown in further detail in subsequent Figures. Additionally, for illustrative purposes, actual ATCA boards are not shown in the drawings herein in order to not obscure the operations of the handle-coupling mechanisms. In general, the handle-coupling mechanisms are disposed between the frontside of a board carrier frame and the backside of a board. It is further noted that in other embodiments, the handles and handle-coupling mechanisms described herein may be coupled directly to a board, rather than coupled to a board carrier frame.

The link 102 of the single-bar linkage is coupled to handles 100A and 100B at respective link pivots 114 and 116 located at opposing ends of the link. The location of the link pivots are important. If the pivots are not properly located, the handles may not fully rotate in the desired direction. Furthermore, it is advantageous to configure the pivot such that the handle rotates in a mirrored manner. This may be obtained by locating link pivots 114 and 116 at the same radius with respect to their handle's pivot point (e.g., handle pivot 104 for link pivot 114 and handle pivot 106 for link pivot 116) and at approximately the same relative angle away from the vertical plane passing through the handle pivots. In one embodiment, link pivot 114 is located approximately +30° from this vertical plane, while link pivot 116 is located approximately –30'.

Figure 1B:
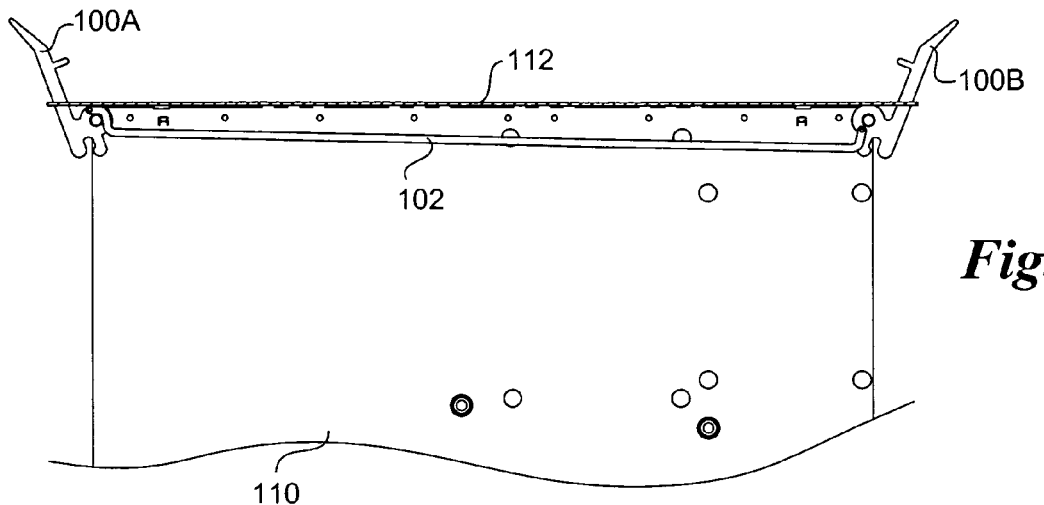
FIGS. 1b–d respectively show the handle-coupling mechanism of FIG. 1a in an open, partially-closed, and closed position.
Figure 1C:
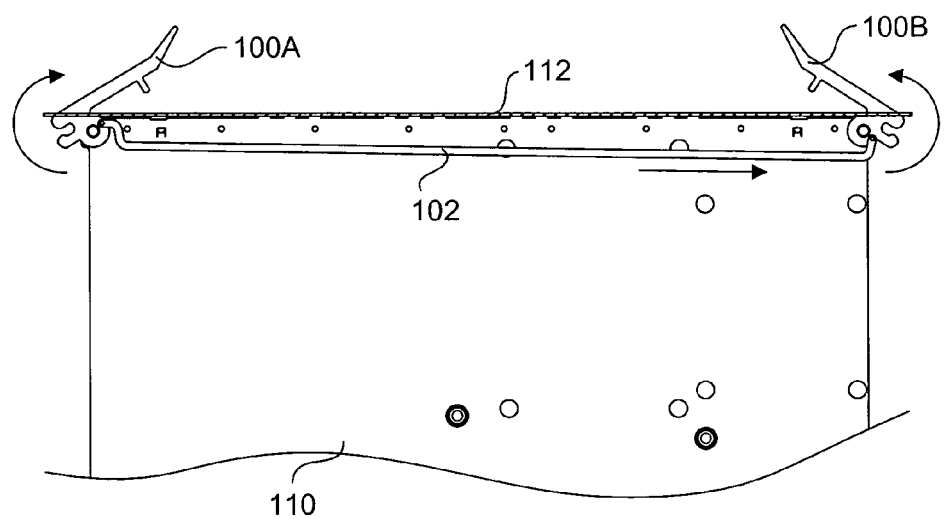
Figure 1D:
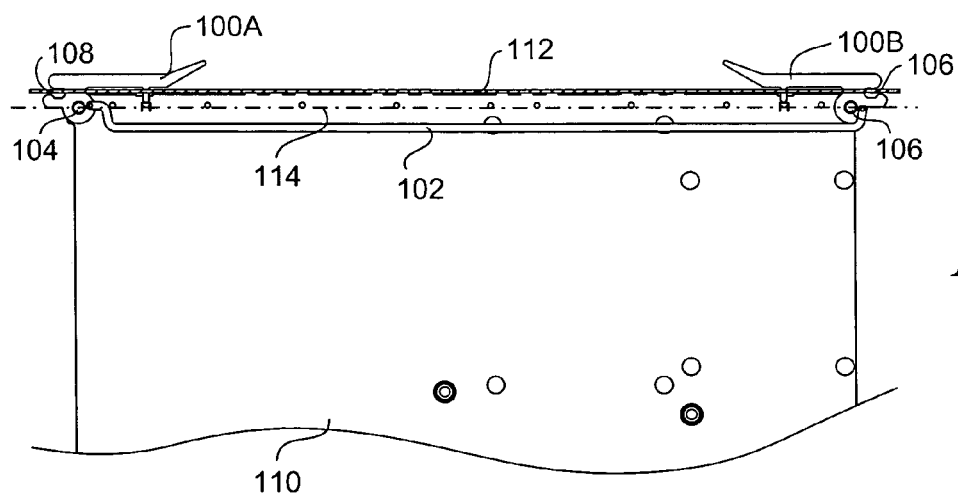

FIGS. 1b–d show two-dimensional views of how the single-bar linkage couples the motion of handles 100A and 100B. In the illustrated embodiments of FIGS. 1a and 1b, the handles 100A and 100B are rotated approximately 110° from horizontal, which is termed the "open" or "extracted" position. (It is noted that the 110° position is merely exemplary, as other angles generally greater than 90° from horizontal may also be used.) In response to an inward rotation applied to one of handles 100A or 100B, the other handle is caused to rotate via a moment applied through link 102 as a result of a horizontal line of action through the link, as shown in FIG. 1c. The inward rotation is continued until the handles reach the "closed" or "latched" position shown in FIG. 1d.

Figure 2A:
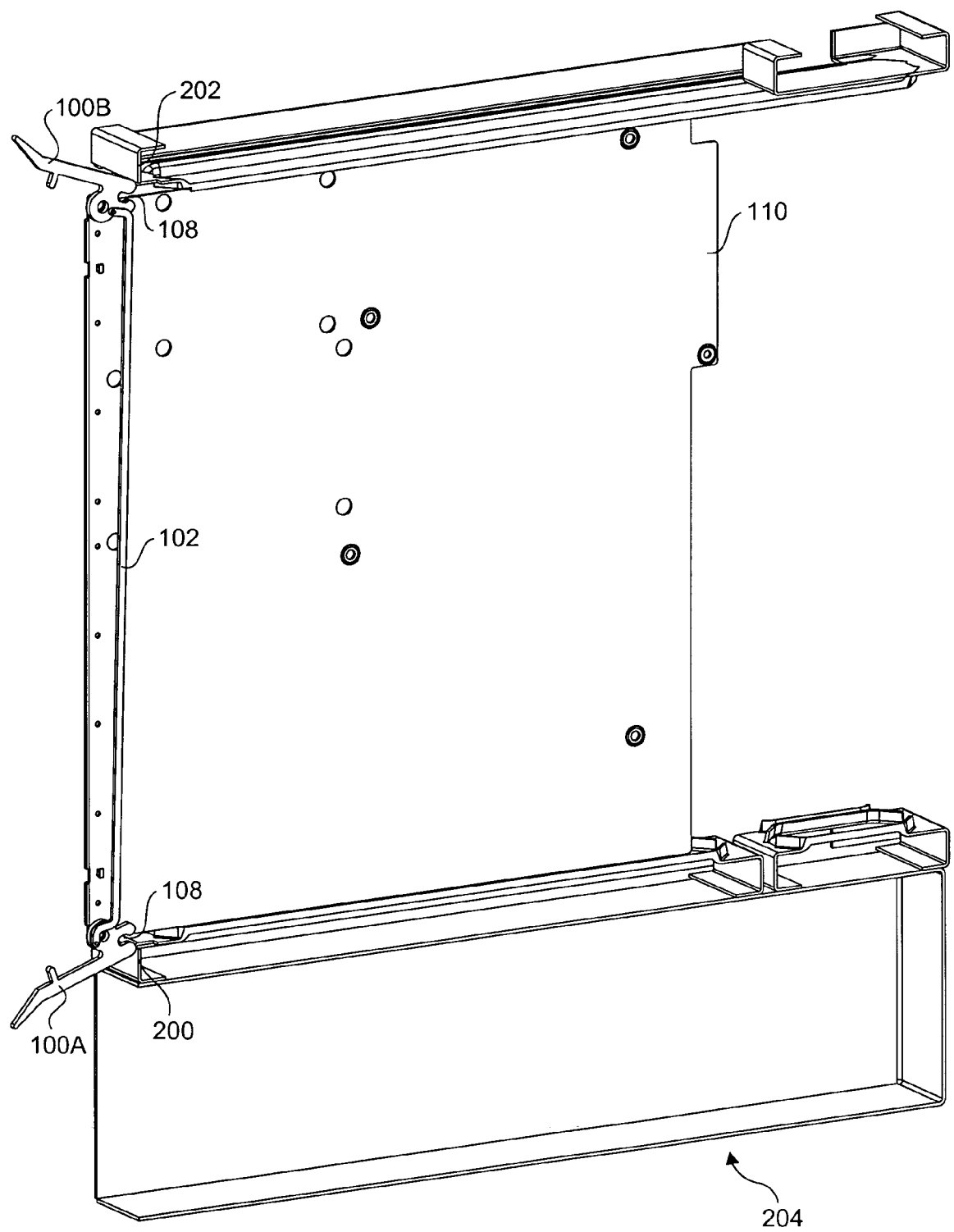
FIG. 2a is an isometric view of a first position of board insertion sequence, wherein the handles are in the open position.
Figure 2B:
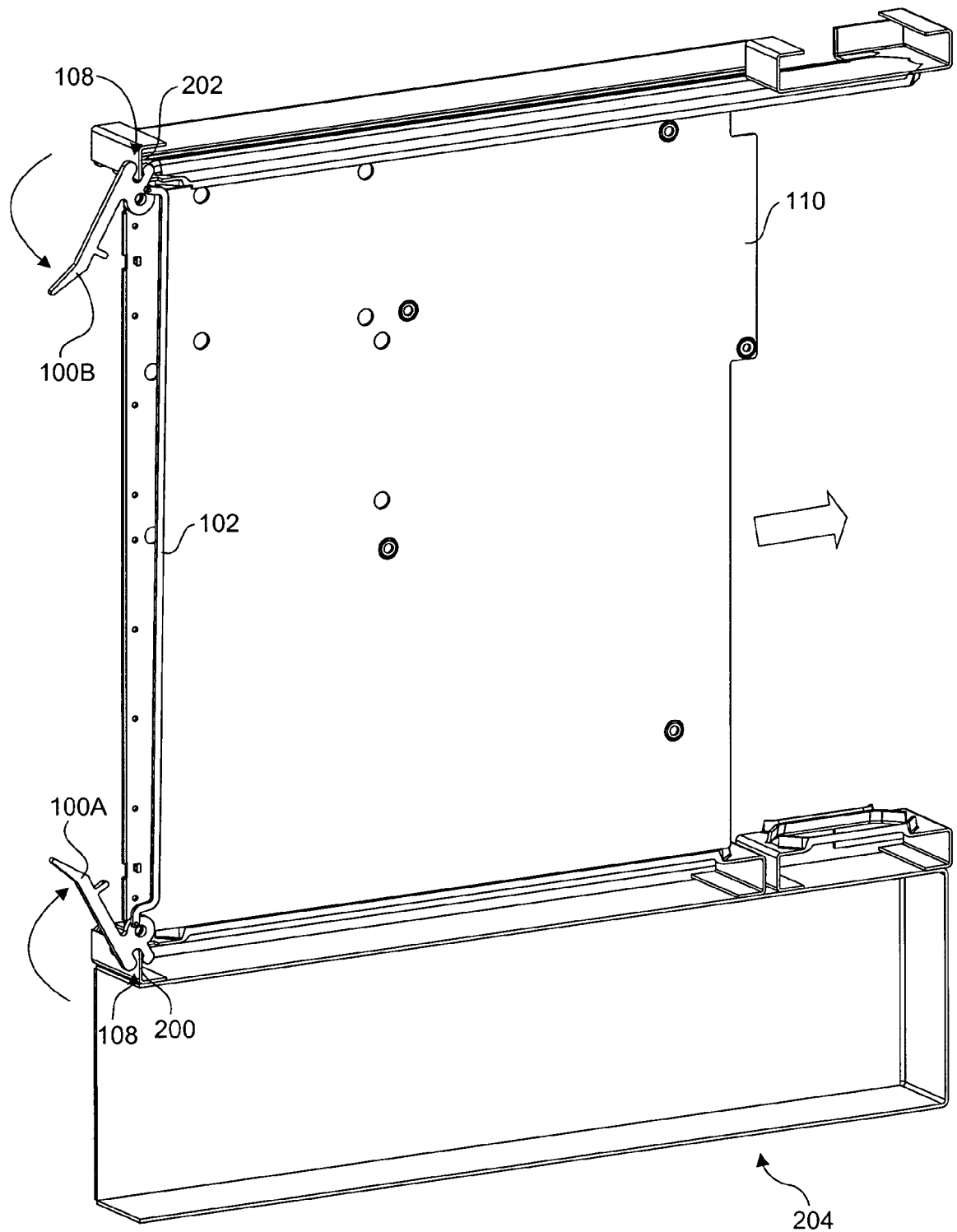
FIG. 2b is an isometric view of a second position of board insertion sequence, wherein the handles are rotated to begin insertion of the board.
Figure 2C:
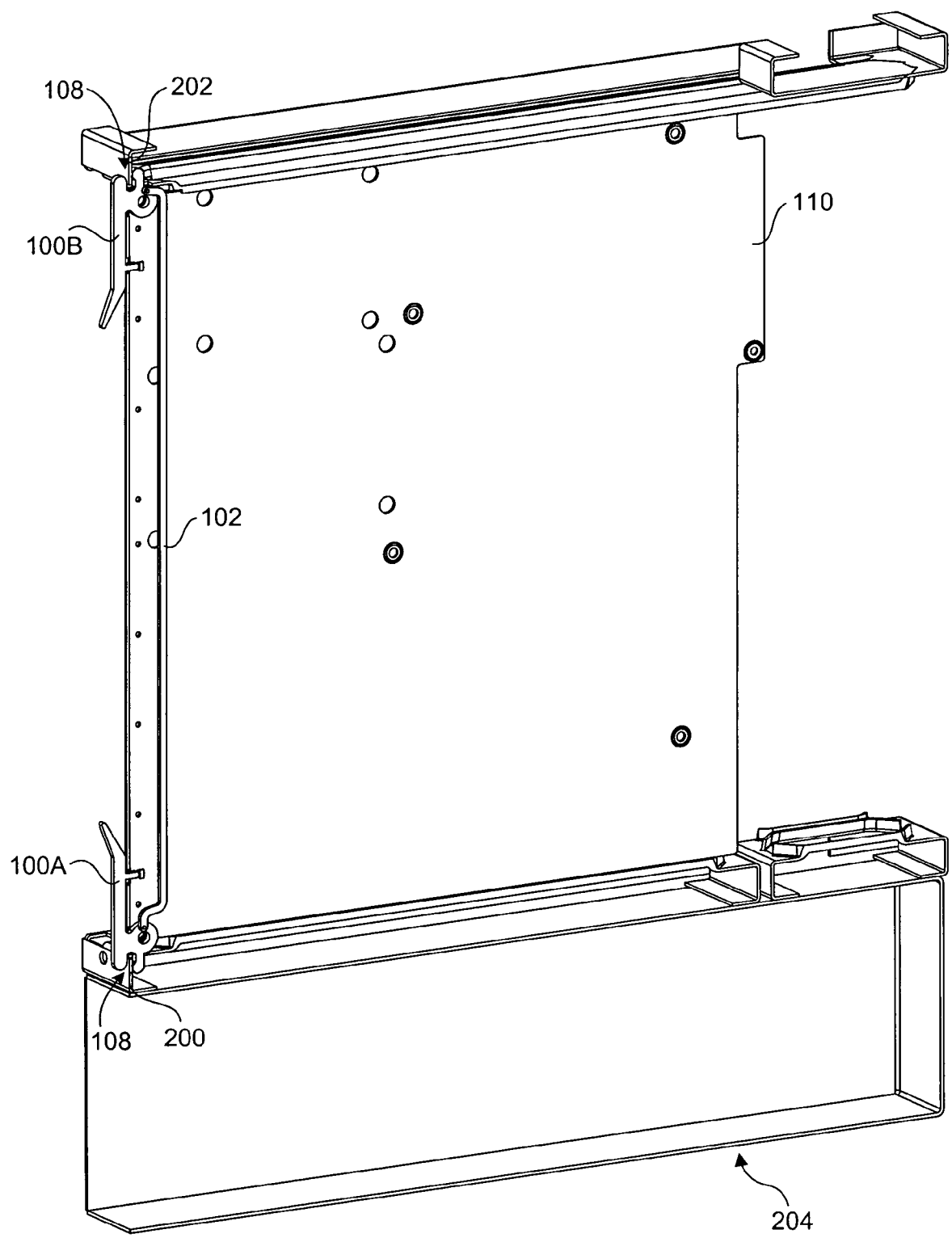
FIG. 2c is an isometric view of a third position of board insertion sequence, wherein the handles have been rotated to a closed position.
Figure 3A:
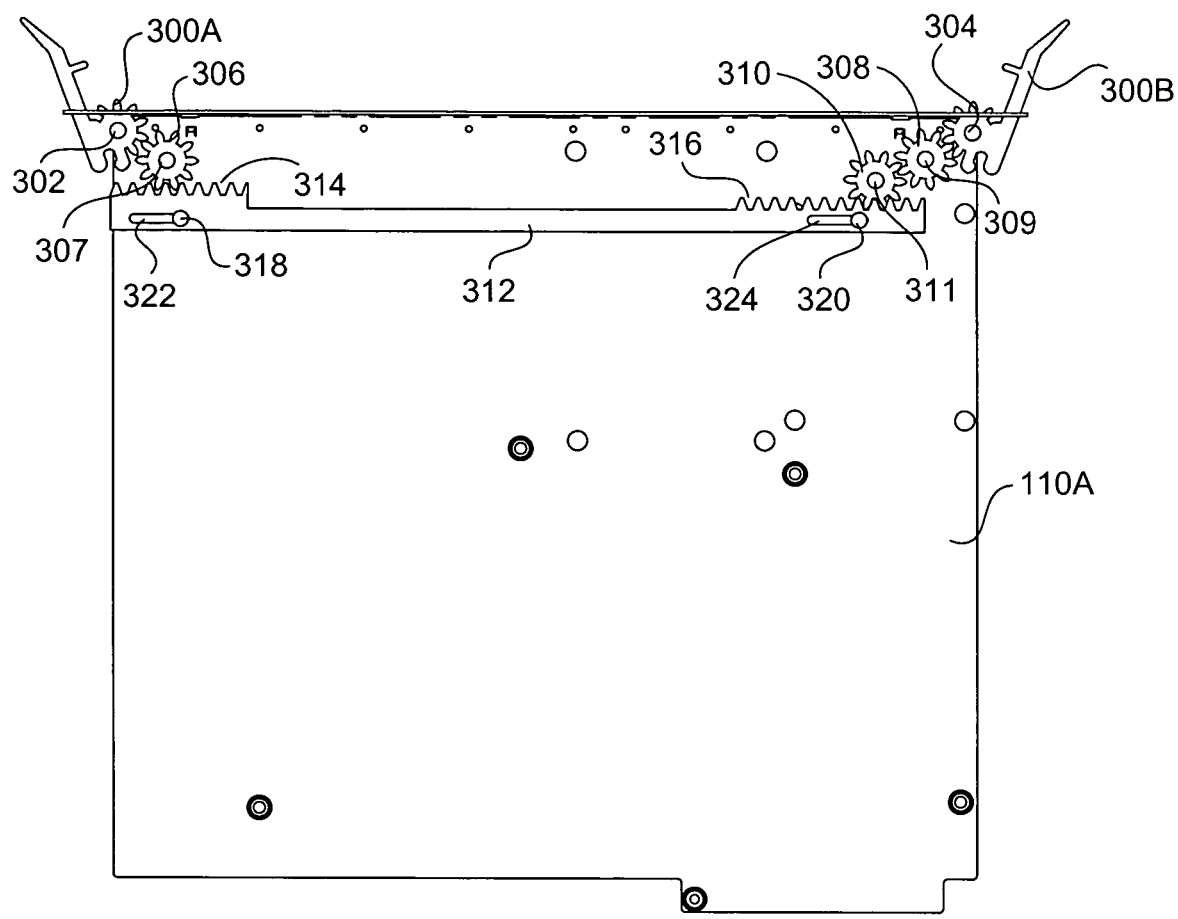
FIG. 3a is an elevation view of a handle-coupling mechanism that employs a rack and pinion-based configuration, wherein the handles are in an open position.
Figure 3B:
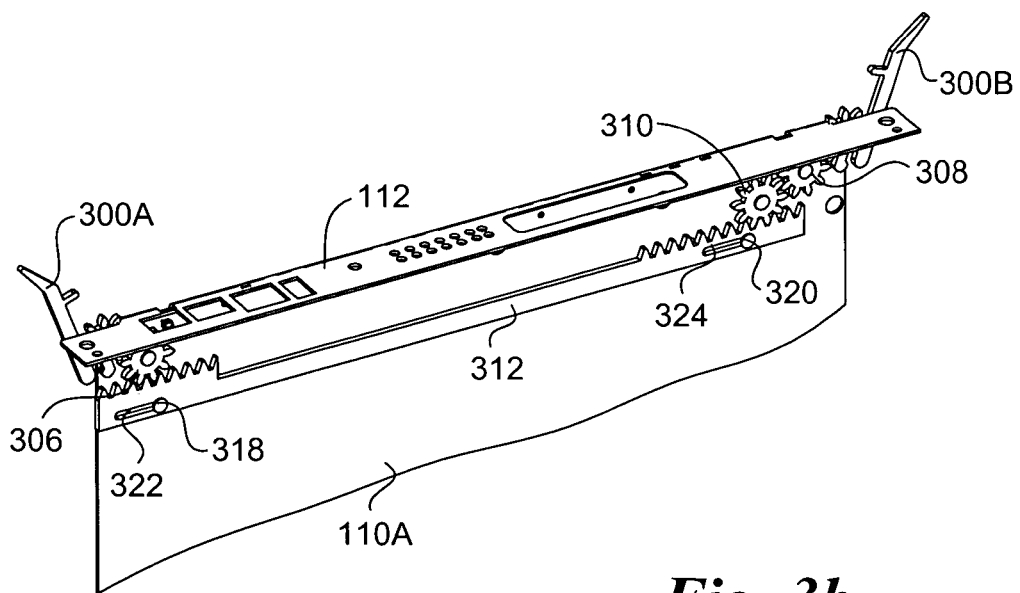
Figure 3C:
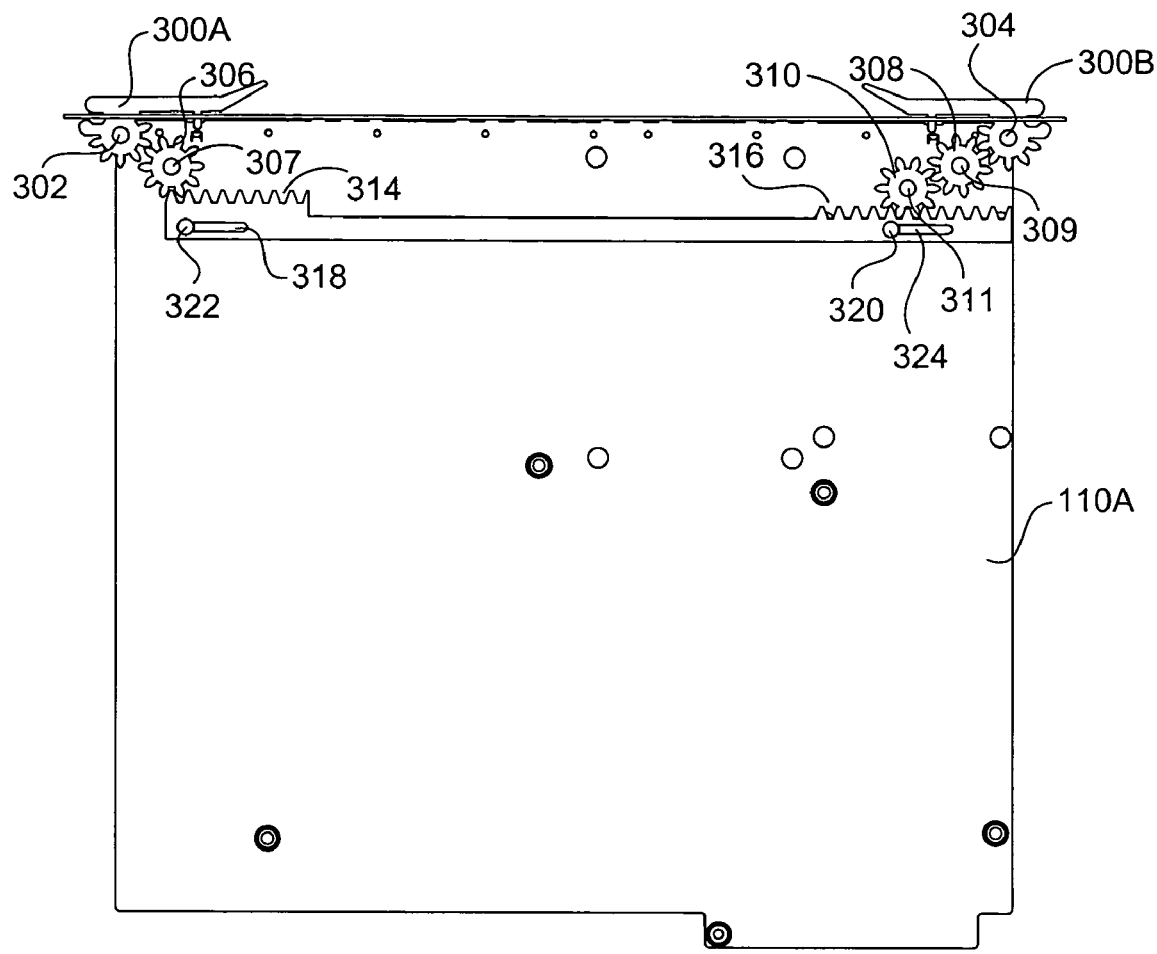
FIG. 3c is an elevation view of the handle-coupling mechanism of FIG. 3a, wherein the handles have been rotated to a closed position.
Figure 3D:
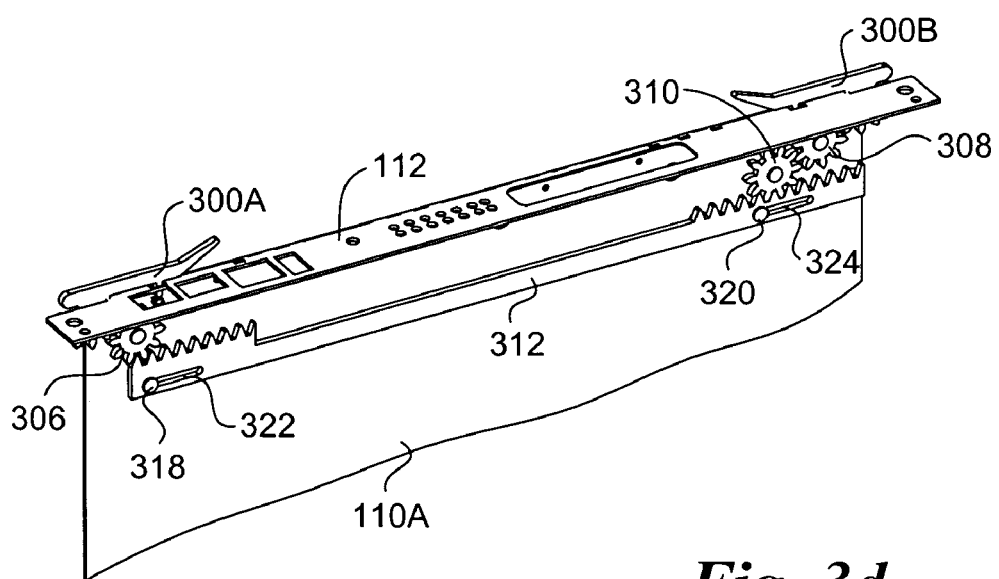
FIG. 3d is an isometric view of the handle-coupling mechanism configuration of FIG. 3c.

A sequence of isometric views illustrating details of an exemplary board insertion sequence using the single-bar linkage coupling mechanism of FIGS. 1a–d is shown in FIGS. 2a–c. As shown in FIG. 2a, when the board carrier frame 110 (to which an ATCA board would be coupled (not shown for clarity)) is initially inserted into an ATCA chassis slot, the front portion of handles 100A and 100B respectively contact the lower flange 200 and upper flange 202 of the chassis' card rack 204. As one of the handles is rotated in FIG. 2b, the clasps 108 begin to engage the upper and lower flanges, urging the board inward. In the closed position shown in FIG. 2c, the board carrier frame (and thus the board) is fully inserted, with the board's connectors coupled to the backplane connectors (both not shown).

In one embodiment, handles 100A and 100B are configured to facilitate an over-center latching mechanism. That is, the location of clasp 108 is "over" the centerline of the handles pivot with respect to the handle's longitudinal access. For example, in the closed position of FIG. 1d, the location of clasp 108 is above (over) a centerline passing through handle pivots 104 and 106. This produces a latching effect when the handle is rotated, causing the handle to be secured (latched in place).

It is noted that link 102 is configured so to not encounter a "connector zone adjacent to front panel 112 when handles 100A and 100B are rotated. Typically, one or more input/output connectors may be coupled to front panel 112, with part of the connector sticking out the backside of the front panel. Link 102 is shaped so as to not interfere with these connectors.

In general, handles 100A and 100B and link 102 may be made of a suitable metal or plastic. In one embodiment, each of these components is made from an aluminum alloy. It will typically be advantageous to use metal pins or the like at the link pivots. Handle pivots 104 and 106 may typically comprise a metal or plastic plain bearing.

FIGS. 3a–d show various configurations for a second handle-coupling mechanism embodiment that employs a rack and pinion-type design. Geared handles 300A and 300B are disposed at opposing ends of a board carrier frame 110A, and rotate about respective pivots 302 and 304. The left-hand gearset includes a pinion gear 306 that rotates about a pivot 307 and includes gear teeth that are directly coupled to the gear teeth of geared handle 300A. The right-hand gearset includes an idler gear 308 that is coupled between geared handle 300B and a pinion gear 310, thus enabling gear handle 300B to drive pinion gear 310. Idler gear 308 rotates about a pivot 309, while pinion gear rotates about a pivot 311.

As one of pinion gears 306 or 310 is caused to rotate via application of a rotate applied to one of gear handles 300A or 300B, a gear rack 312 is caused to move horizontally left or right (as applicable) via engagement of gear teeth 314 and 316 with pinion gears 306 and 310, respectively. This, in turn, causes the other pinion gear to rotate at a matching angle, thus synchronizing the motion of the pinion gears. However, due to the existence of an idler gear on only one side, geared handles 300A and 300B rotate in the opposite direction. When appropriately-sized gears (and corresponding gear ratios) are selected, the rotation of geared handles 300A and 300B can be made to mirror each other.

In general, various techniques may be employed to keep gear rack 312 engaged with pinion gears 306 and 312. In the illustrated embodiment, pins 318 and 320 are coupled to board carrier frame 110A and slidingly engage the edges of respective slots 322 and 324. Each of pins 318 and 320 include a head that is used to encapsulate the gear rack between the pin head and board carrier frame 110A. In another embodiment, one or more "S" brackets with tangs that overlap the lower edge of gear rack 312 may be employed. The gear may also be retained using one or more "C" brackets in a similar manner.

In the illustrated embodiment, gear rack 312 is disposed horizontally. However, this is merely one exemplary orientation for the gear rack. The gear rack may also be disposed at an angle, with corresponding changes to the sizes and/or positions of the various gears used to drive the gear rack. It is noted that the height of the gear teeth relative to the base of gear rack 312 is higher on the left-hand side (for gear teeth 314) than the right-hand side (for gear teeth 316) due to the lower position of pinion gear 310 relative to pinion gear 306. The gear sets may also be configured such that the pinion gears are aligned horizontally.

Generally, the various gears and the gear rack may be made from suitable metals, plastics, or may be formed of a composite construction. In one embodiment, handles 300A and 300B are formed of metal, while gear rack 312 is formed from a high-strength, good-lubricating plastic, such as but not limited to nylon, nylatron, acetal, Delrin®, or polycarbonate. Fiber-reinforced plastics may also be used. Plastic for the gear rack is advantageous with respect to reducing friction between the gear rack and the board carrier frame. Optionally, a suitable lubricant may be used to reduce the friction between these components.

The rack and pinion embodiment provides the advantage of being very low in profile, since all moving components are disposed in the same plane. However, it is more complicated than the single-bar linkage configuration discussed above.

A third embodiment of a handle-coupling mechanism employing a two-bar linkage is shown in FIGS. 4a–d. Under this configuration, respective handles 400A and 400B are disposed on opposing ends of a board carrier frame 110B and rotate about respective handle pivots 402 and 404. Handle 400A is pivotally coupled to one end of a left-hand bar 406 via a pivot 408. Meanwhile, handle 400B is pivotally coupled to one end of a right-hand bar 410 via a pivot 412. The left- and right-hand bars 406 and 410 are pivotally coupled via a pin 414. This pin is disposed in a slot 416 formed in board carrier frame 110B. The slot is used as a restraint that only allows pin 414 (and thus the ends of the left- and right-hand bars 406 and 410) to move in a vertical direction. In an optional configuration, the location of the pin and a pivotal coupling between the left and right-hand bars may be at different locations along a line substantially perpendicular to a centerline passing through the handle pivots 402 and 404.

Figure 4A:
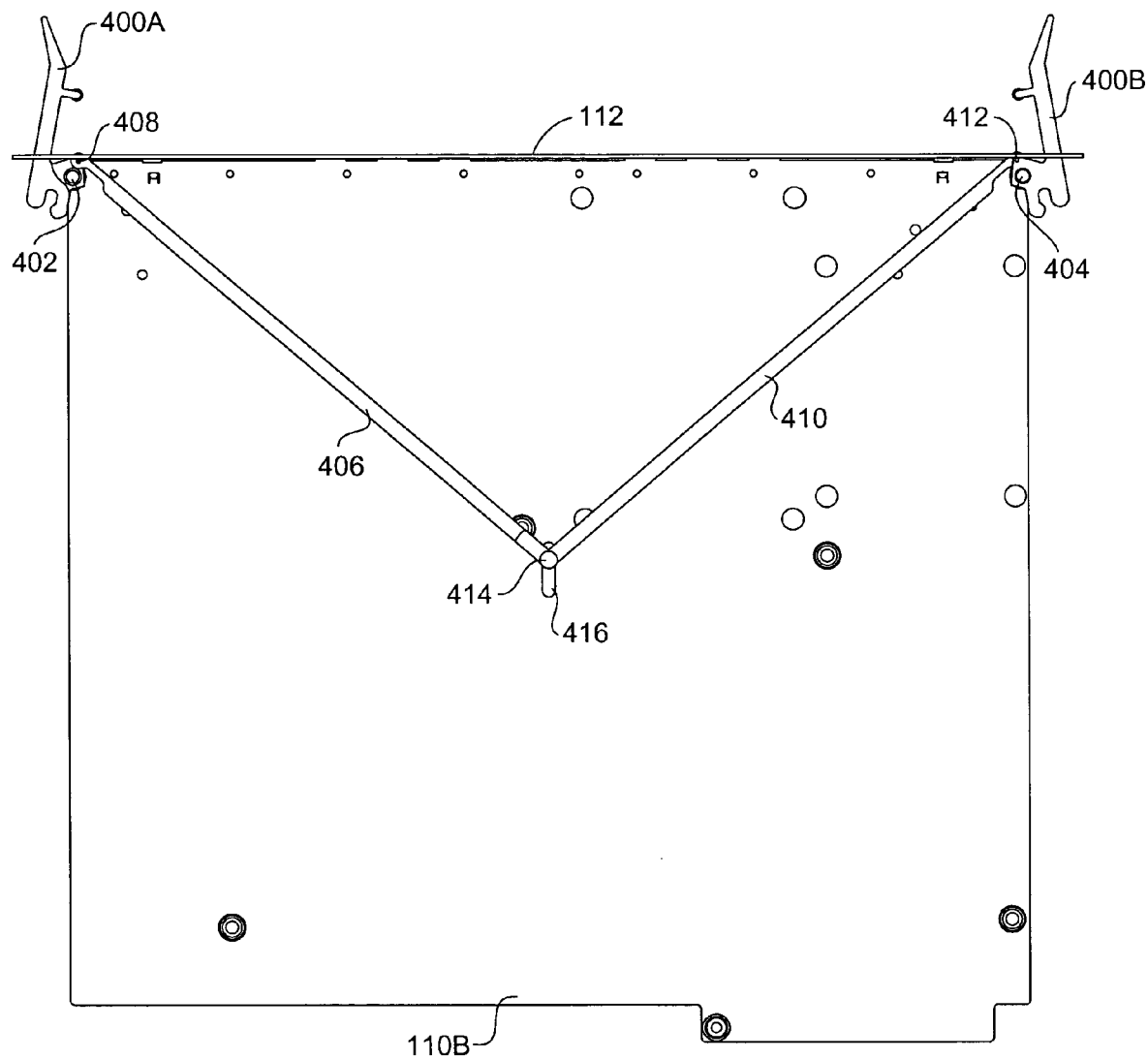
FIG. 4a is an elevation view of a handle-coupling mechanism that employs a two-bar linkage.
Figure 4B:
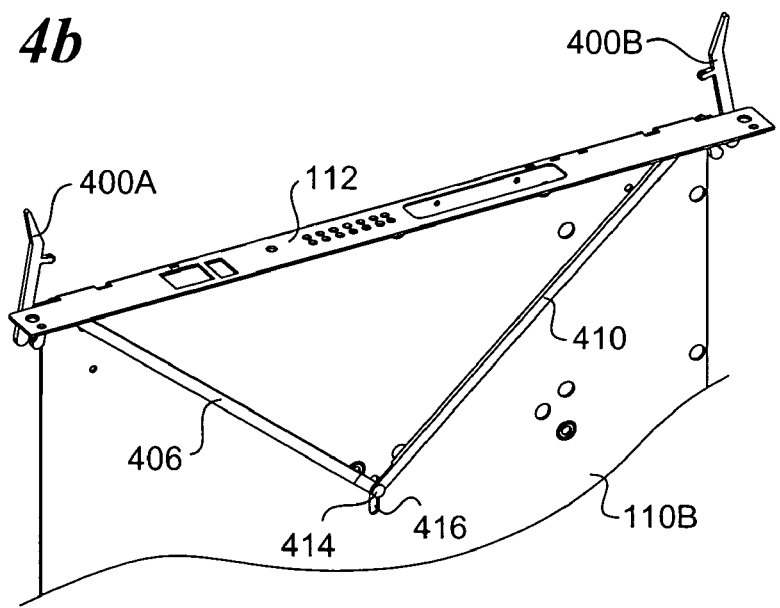
Figure 4C:
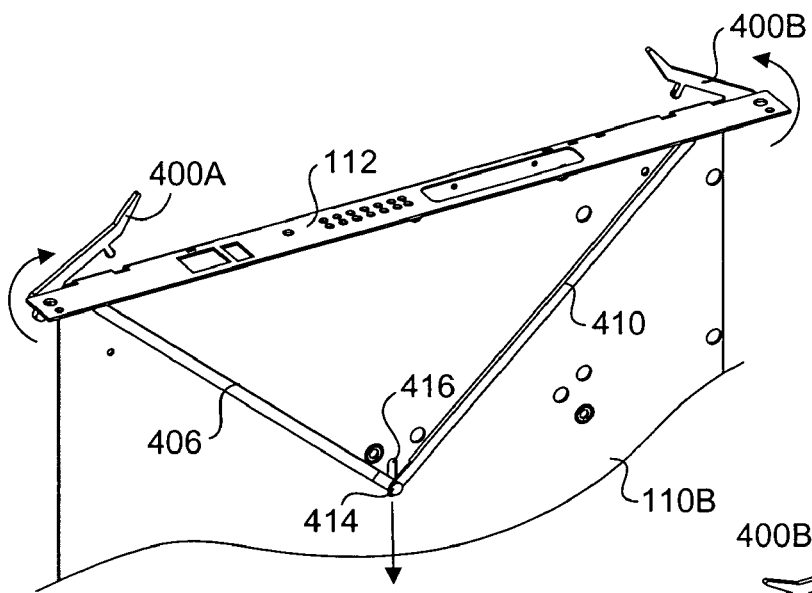
Figure 4D:
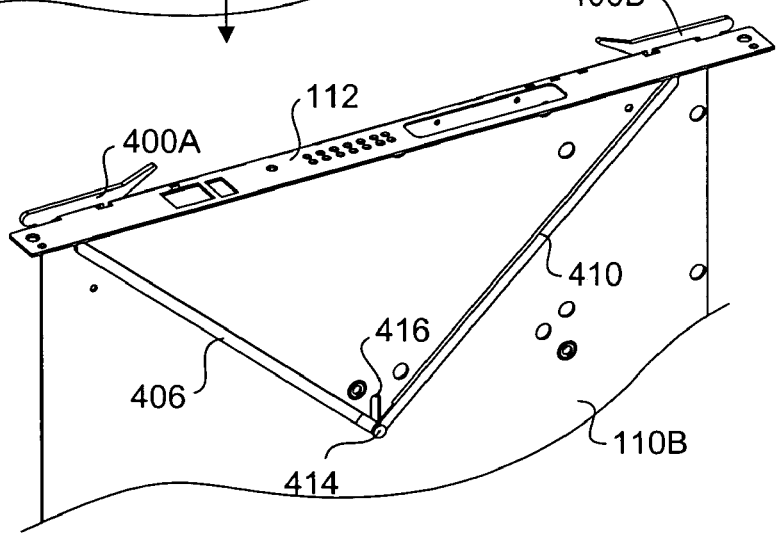

A motion sequence illustrating the operation of the two-bar linkage handle-coupling mechanism is shown in FIGS. 4b–d. The operation begins with handles 400A and 400B in an open position. (It is noted that in the illustrated embodiment, the handles are approximately at 90° when in the open position.) With the handles in this position, pin 414 is caused to move to the top of slot 416.

In FIG. 4c, each of handles 400A and 400B are rotated inward to a half-closed (approximately) position. For example, suppose an inward force is applied to handle 400A. This causes pivot 408 to move to the right as the handle rotates about its handle pivot 402. Movement of pivot 408 causes left-hand bar 406 to move. Since left-hand bar 406 is pivotally-coupled at pivot 408, the upper end of the bar follows the motion of the pivot. At the same time this causes the pin 414 at the lower end of left-hand bar 406 to move downward toward the bottom of slot 416.

Now consider what happens when pin 414 is moved downward in slot 416 (imagine for the moment that left-hand bar 406 does not exist and a downward force is simply applied to pin 414. This pulls the lower end of right-hand bar 410 downward, which applies a counter-clockwise moment about handle pivot 404. This moment, in turn, causes handle 400B to be rotated inward (to the left).

As handle 400A continues to be rotated inward, pin 414 continues to move downward in slot 416 until handle 400A reaches its closed position. At the same time, the counter-clockwise moment applied to handle 400B continues to rotate handle 400B until it reaches its closed position. Thus, handles 400A and 400B are coupled so as to cause them to move in a mirrored manner.

In FIGS. 4a–d, the left- and right-hand bars are declined at approximately 45° (on average). However, this is merely exemplary of one embodiment of the two-bar linkage. The angle of the left- and right-hand bars may be shallower or steeper, depending on the requirements of the implementation. A steeper configuration will generally produce less friction at pin 414 and the edges of slot 416, since the angle between the line of force of the bar (parallel to the bar) and the direction of the slot is reduced. However, the steeper configuration also requires more area and longer bars, so there is some tradeoff to be considered.

Another handle-coupling embodiment that occupies a small footprint is shown in FIGS. 5a–e. Under this configuration, handles 500A and 500B are pivotally coupled to a board carrier frame 110C at respective handle pivots 502 and 504. Handle 500A is pivotally-coupled to a left-hand telescoping member 506 at a pivot 508, while handle 500B is pivotally coupled to a right-hand telescoping member 510 at a pivot 512.

The left- and right-hand telescoping members 506 and 510 are slidingly coupled in a telescopic configuration. This enables the telescoping members to slide relative to one another along their longitudinal axes, while also enabling a force applied in a transverse direction to one of the members to be transferred to the other member. In the illustrated embodiment, the free end of left-hand telescoping member 506 is configured in a U-shaped yoke having arms 514 and 516, which are configured to form a slot 518 that is slightly larger than the width of right-hand telescoping member 510 at its free end.

The configuration described thus far may be caused to move in a manner that couples handles 500A and 500B. However, it has one too many degrees of freedom to couple the handles so that their motion is mirrored. This may be solved by constraining the motion of one of the left- and right-hand members such that its longitudinal axis remains horizontal throughout its motion. As a result of the telescopic engagement between the members, the other (non-constrained) member is likewise caused to move such that its longitudinal axis remains horizontal throughout its motion.

In one embodiment, a pin 520 is coupled to right-hand telescoping member 510 toward the member's free end. Meanwhile, an arc-shaped slot 522 having a width substantially equal to the diameter of pin 520 is formed in board carrier frame 110C. This arcuate (e.g. arc-shaped) slot follows the same arc as the arc formed by the motion of pivot 512 as handle 500B is rotated about its handle pivot 504. Thus, rotation of handle 500B causes right-hand telescoping member 510 to move both upward and sideways, while maintaining the bar's longitudinal axis in the horizontal plane (with respect to the orientation shown in FIGS. 5a–e).

Figure 5A:
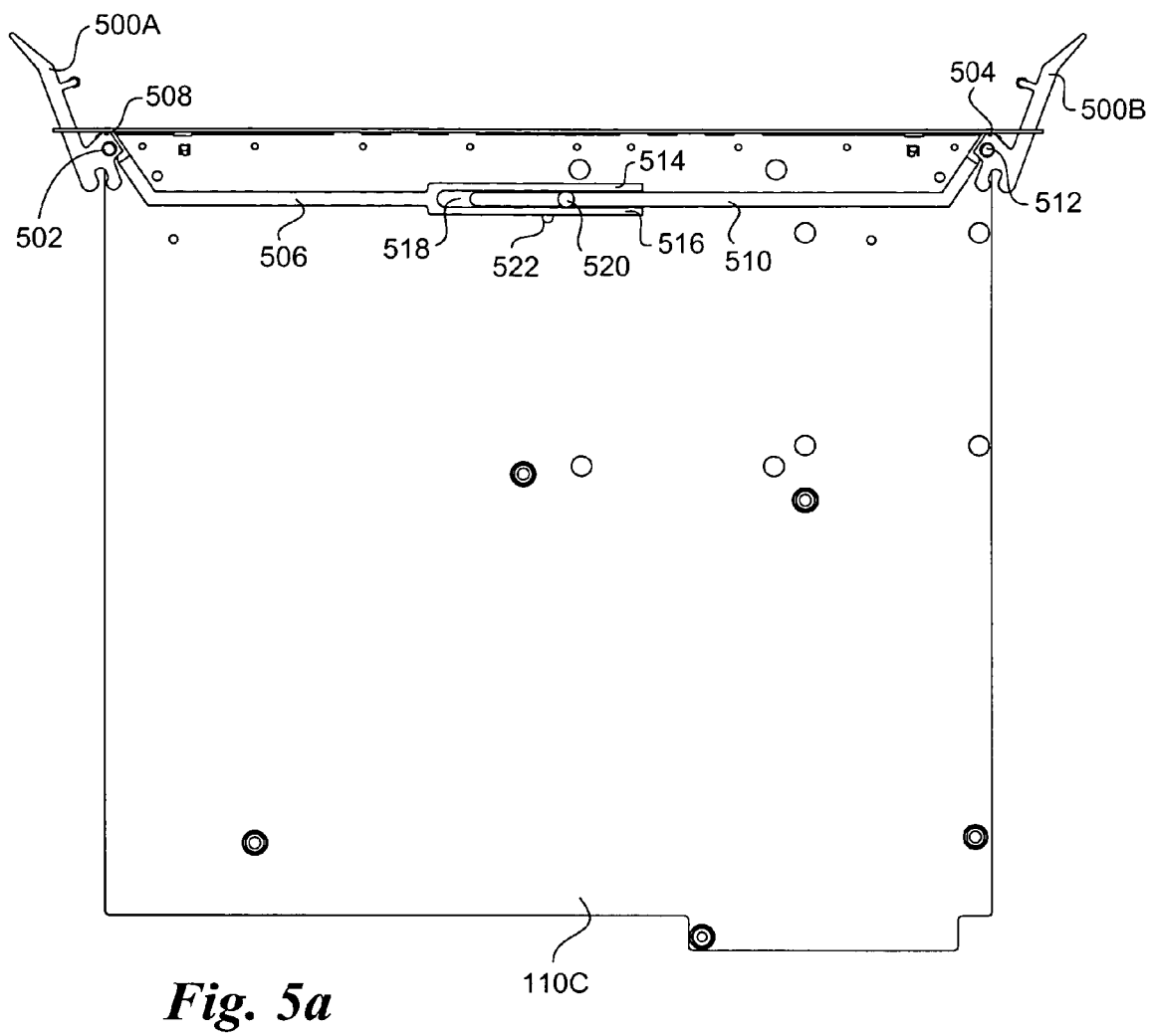
FIG. 5a is an elevation view of a handle-coupling mechanism employing a telescoping linkage, wherein the handles are in an open position.
Figure 5B:
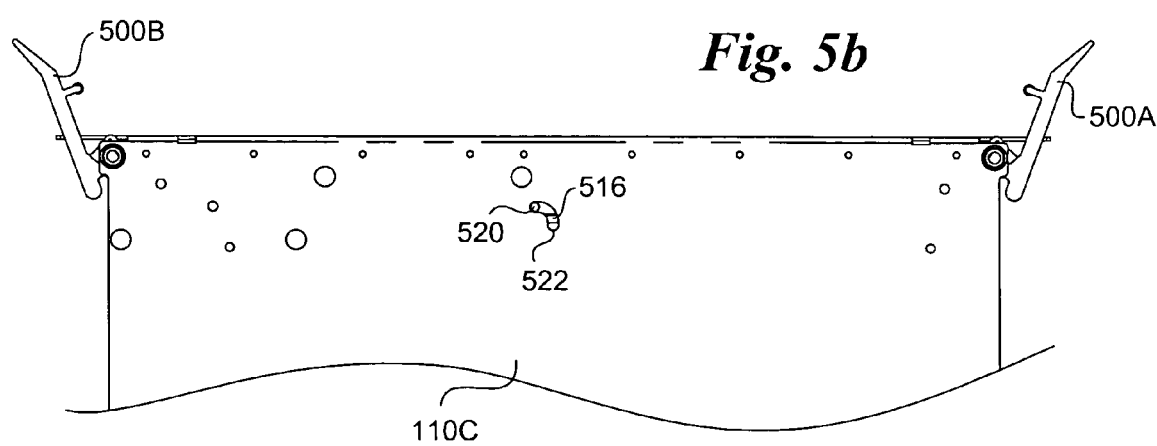
Figure 5C:
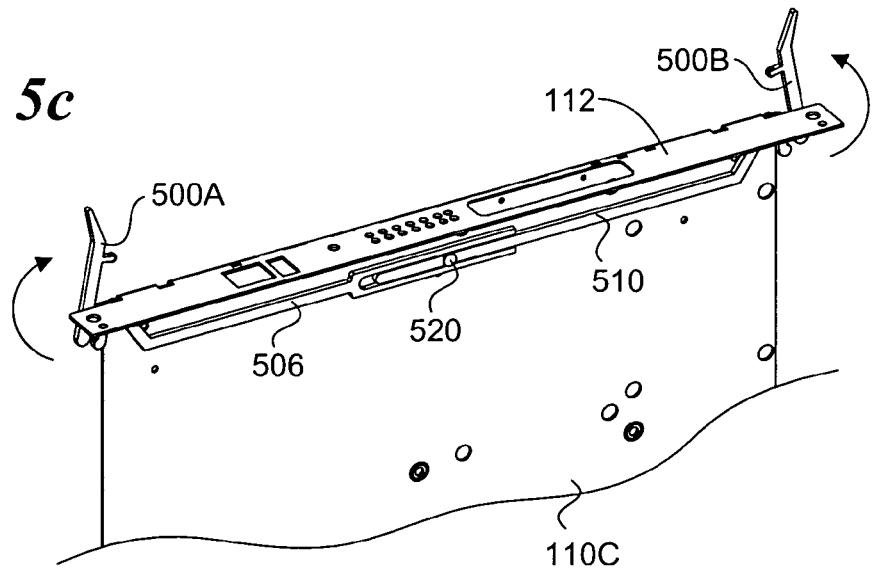
FIGS. 5c–e respectively show isometric views of an open, partially-closed, and closed configuration corresponding to the handle-coupling mechanism of FIGS. 5a and 5b.

The operation of the present embodiment works as follows. FIG. 5c shows a starting position with both of handles 500A and 500B in their open positions. Under this configuration, left- and right-hand telescoping members 506 and 510 are horizontally disposed at an initial "up" position. Now, suppose a force is applied to handle 500B to rotate this handle inward. This causes right-hand telescoping member 510 to move to the left and downward, with the ends of the right-hand telescoping member following the arcs defined for arc-shaped slot 522 and the arc of pivot 512 about pivot 504. The horizontal portion of the motion has no affect on left-hand bar 506, since it is free to move in its longitudinal axis relative to the longitudinal axis of right-hand bar 510 (which are both horizontal in this case). However, the downward portion of the motion of right-hand bar 510 is followed by left-had bar 506. This creates a moment about handle pivot 502 acting at pivot 508, thus rotating handle 500A inward.

Figure 5D:
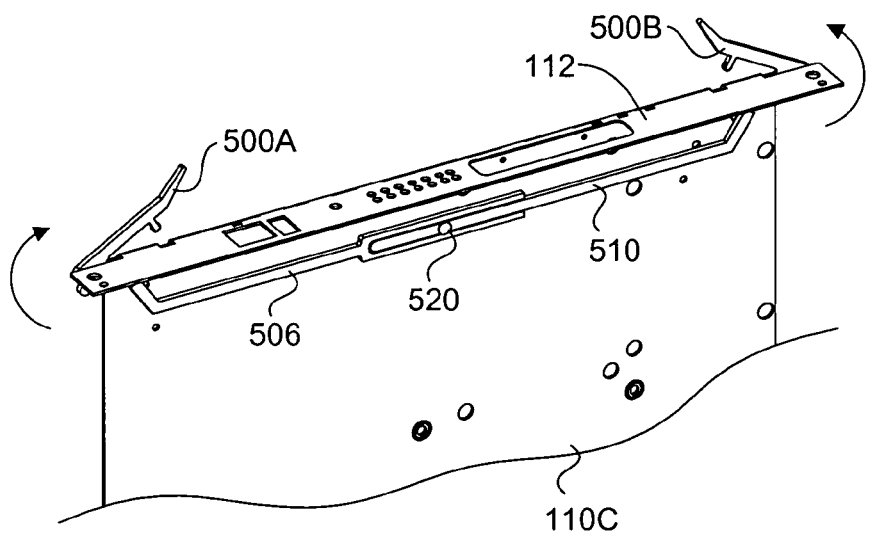
Figure 5E:
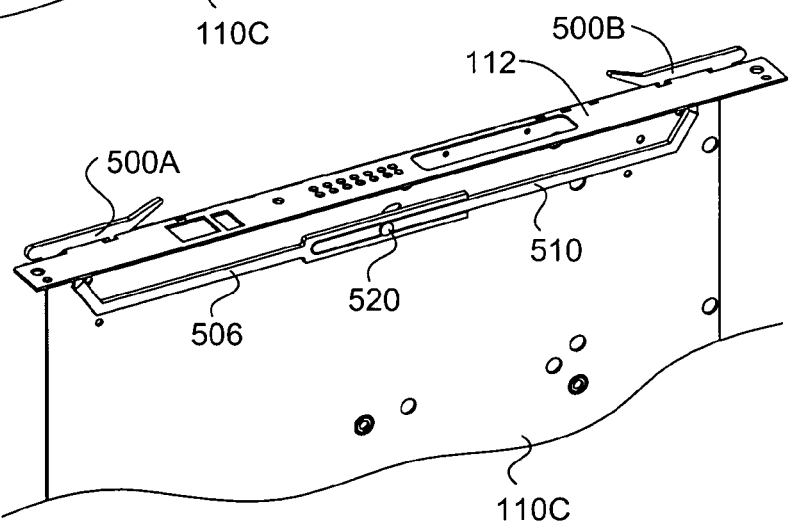

As shown in FIGS. 5d and 5e, continued rotation of handle 500B causes the telescopic linkage to move further downward, until both handles reach their closed positions shown in FIG. 5e. Rotation outward of one of the handles causes similar motions in the reverse direction to occur, thus enabling both handles to be opened by applying an outward rotation to a single handle.

Another feature defined by the ATCA specification is the use of captive retention screws (e.g., thumb screws) to secure a board (via the front panel of its board carrier frame) that has been inserted into a chassis slot. First, the handles for the board are rotated inward using two hands until the board connectors are fully coupled, at which point the handles are rotated to their closed positions. The thumb screws are then turned (generally one at a time) until the screw are fully engaged in their respective holes in the card cage.

According to further aspects of the insertion and ejection mechanism, a motorized retention screw insertion/extraction mechanism is provided for automating this process. Details of one embodiment of the mechanism are shown in FIGS. 6a–e. In one embodiment, an automated retention screw insertion/extraction mechanism 600 employs a spring-loaded captive thumb screw 601 that is mounted to a front panel 112 a board carrier frame 110. A gear 602 is coupled to a head 604 of thumb screw 601. A gear 606 is used to drive gear 602, and thus turn thumb screw head 604. The gear 606 is mounted on the shaft 608 of a gearmotor 610, which is mounted to front panel 112 via a mounting bracket 612.

Figure 6E:
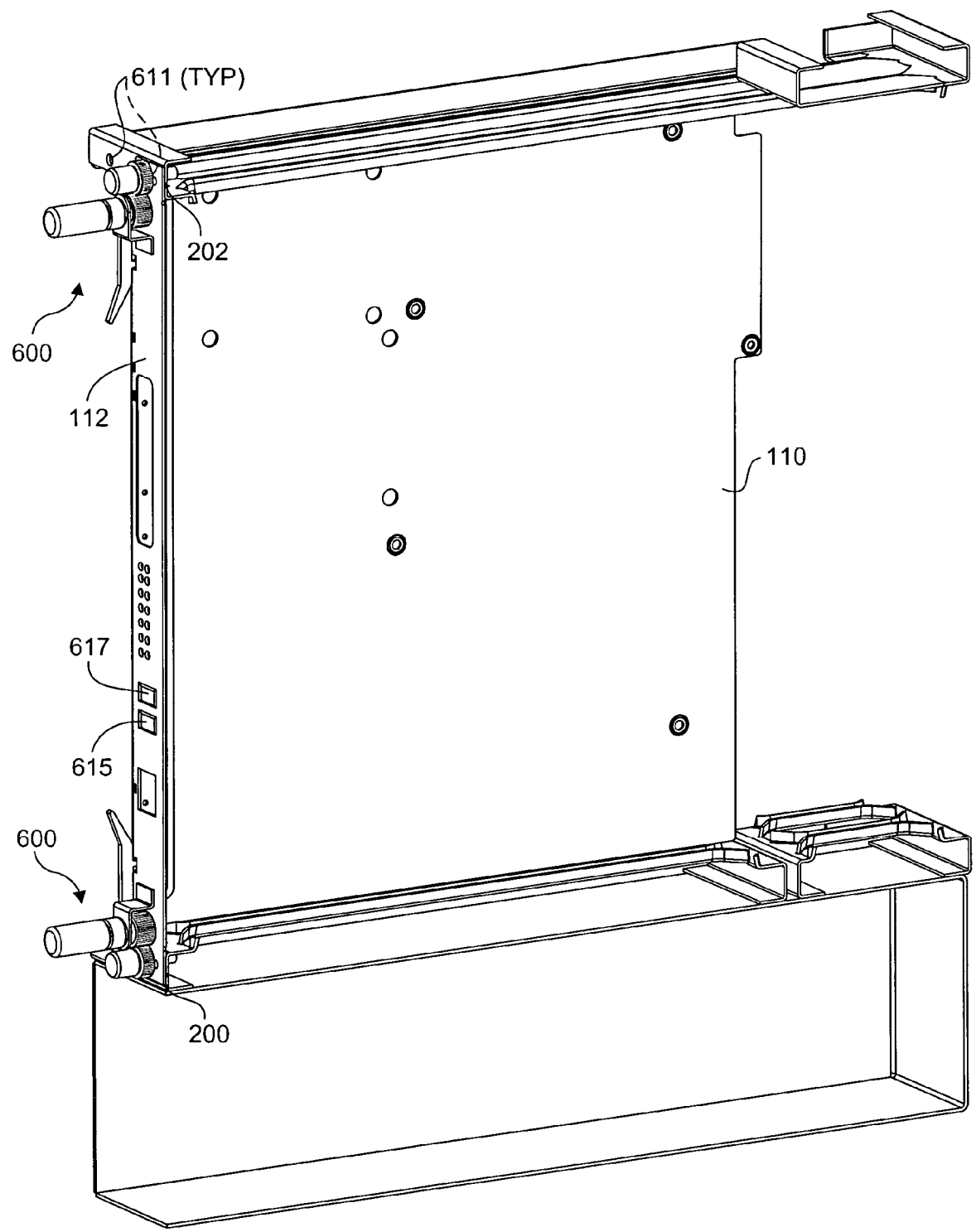
FIG. 6e is an isometric view of a board carrier frame inserted into a chassis slot, wherein the board carrier frame implements the automated retention insertion/extraction mechanism of FIGS. 6a–d.

The mechanism works in the following manner. The board insertion process is similar to that illustrated in FIGS. 2a–c and discussed above. First, the board is pushed into an unoccupied chassis slot. At this point the shafts 603 of the spring-loaded thumb screws 601 are extended beyond the inner face of front panel 112, as shown in FIG. 6a. As the board is inserted further in FIG. 6b, the handles begin to engage the flanges 200 and 202 in the chassis 204. At approximately this point, the leading faces 605 of the shafts 603 come into contact with corresponding holes 611 (see FIG. 6e) formed in flanges 200 and 202. Because the major diameter of the shafts is larger that the diameter of holes 611, only a short portion of the minor diameter of the shafts passes into the holes.

As the handles are rotated inward, as shown in FIGS. 6b and 6c, the board is urged forward, moving toward the back of the chassis. At the same time, the shafts 603 of the spring-loaded thumb screws 601 do not move relative to flanges 200 and 202. Rather, as the board and (in particular) front panel 112 moves forward due to the lever action of the handles, an internal spring (not shown) enables the shafts to move outward relative to the front panel. Upon reaching the closed position for the handles, the leading faces 605 of the shafts 603 are approximately parallel with the inner face of front panel 112, wherein the inner face is in contact with flanges 200 and 202. This configuration is illustrated in detail in FIG. 6c.

At this point, the leading face of gear 602 is displaced from front panel 112. In response to activation of gearmotors 610, gear 608 engages gear 602 turning head 604 of thumb screw 601 clockwise in a manner similar to that which would be applied by a hand turning the thumb screw. Since the thumb screw's shaft is spring-loaded against the flange 202 (or 200), rotation of the thumb screw in the clockwise direction (assuming a right-hand thread is used) will cause the thumb screw to be inserted into hole 611, without requiring an inward force be applied to thumb screw head 604.

As the gear 602 and thumb screw head 604 are rotated, the screw threads are inserted into hole 611, causing the leading face of gear 602 to move closer to front panel 112. The gearmotor continues to rotate until the leading face of gear 602 comes into contact with the front panel. At this point, the thumb screws are fully inserted, securing the board in place.

In order to perform the foregoing operations, a means is provided for activating and deactivating gearmotors 610. In one embodiment, the gearmotors may be activated using an "insert" button 615 (FIG. 6*e*) or the like located on the front panel. In one embodiment, a built-in handle latch switch 614 must be activated prior to enabling activation of the gearmotors. The handle latch switch is used to detect whether a handle is latched or not. For example, the ATCA specification defines the use of a similar-type switch that is coupled to the board. (For point of illustration, the handle latch switch is shown in the figures herein coupled to board carrier frame 110—in an actual implementation, the handle latch switch is coupled to the board). The handle latch switch is activated when the handles are rotated to the closed positions by being pushed down by a protrusion 616 extending inward from the handles. In one embodiment, two handle latch switches 614 are used along with corresponding "AND" logic, thus only indicating that the board is fully-seated when both switches are activated by closure of both handles.

In one embodiment, the board contains a motor drive and logic circuit 620 that is used to control the gearmotors through activation of appropriate input controls. For example, in one embodiment motor drive currents are disabled if either of handle latch switches 614 is not activated (for a two-switch configuration) or if the sole handle latch switch 614 is not activated (for a single-switch configuration). In one embodiment, the motor drive and logic circuit 620 automatically activates the gearmotors when the handle latch switch or switches (as appropriate) are activated.

Another use of motor drive and logic circuit 620 is to stop activation of the gearmotors. In one embodiment, the gearmotors are stopped by deactivation of insert button 615. In another embodiment, the current to the gearmotor is measured by motor drive and logic circuit 620. When the current reaches a certain pre-determined value, the gearmotor has stalled, indicating the screws are fully inserted (e.g., the gear face of gear 602 mates with front panel 112). In another embodiment, the gearmotors are driven for a pre-determined amount of time.

In general, the gearmotors and gears should be selected based on the torque requirements for the application. For example, the gearmotors should provide enough torque to insert the screws, but should produce a stall torque that is less than the torque capacity of the gears, so as not to strip the gear teeth. In one embodiment, the drive current supplied to the gearmotors for screw insertion is less than that supplied for extraction of the screws. This ensures that the screws are not tightened so tight that the gear motors have insufficient torque to extract the screws.

In general, there also needs to be a mechanism to inform the gearmotors when to operate in reverse to extract the thumb screws. In one embodiment a second "extract" button 617 may be used for this purpose. In one embodiment, insert button 615 is used for both insertion and extraction. In this case, logic in motor drive and logic circuit 620 detects the last direction the motor was rotated in. Thus, alternative activation of insert button 615 causes the gearmotors to rotate in forward and reverse directions.

In another embodiment, the handle latch switches are used to instruct the gearmotors when to reverse. For example, as a handle is rotated outward a small angle away from the closed position, handle latch switch(es) 614 become deactivated. This deactivation is detected by motor drive and logic circuit 620, which sends a drive current to the gear motors to run them in reverse to extract the thumb screws. In one embodiment, this drive current is supplied for a predetermined amount of time sufficient to extract the screws. In another embodiment, the torque load on the gear motors is monitored until a pre-determined level indicative that the screws are fully retracted is reached.

Figure 7:
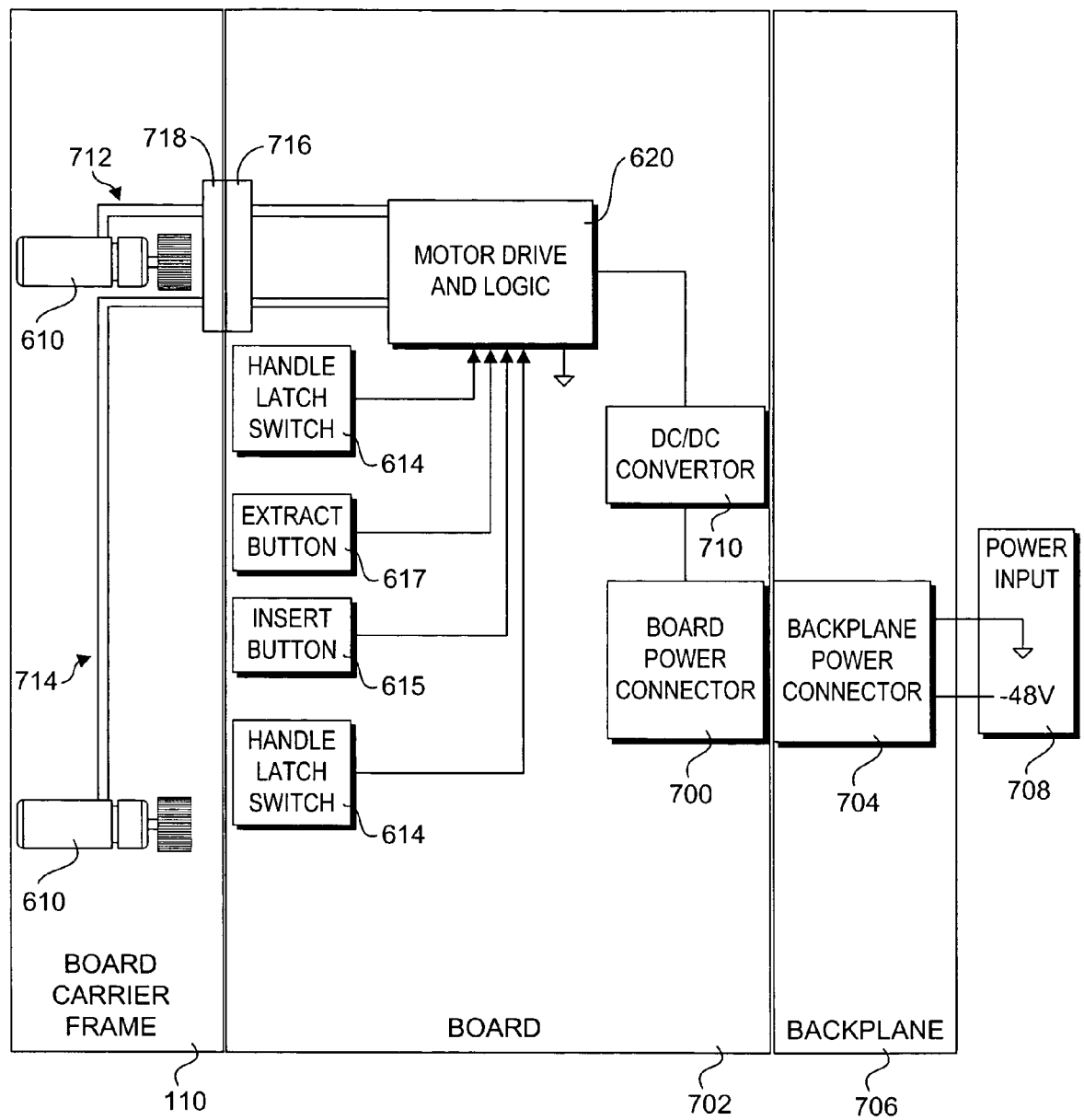
FIG. 7 is a schematic diagram of a motor control subsystem that may be used to control the gearmotors in the automated screw insertion/extraction mechanism of FIGS. 6a–e.

FIG. 7 shows further details of one embodiment of the gear motor drive sub-system. Upon insertion of the board, the board's rear connectors become engaged with the chassis backplane. These connectors include power connectors used to supply power to the board, including a board power connector 700 for a board 702 and a backplane power connector 704 for a backplane 706. Under the ATCA standard, as well as other standards, the backplane power is specified nominally at −48 volts, as depicted by a power input block 708. DC-DC conversion circuitry is typically used to adjust this input voltage to board operating voltages, such as +5 volts, +12 volts, +3.3 volts, etc. This conversion is depicted by a DC/DC converter 710. Thus, the board will typically have DC voltage available to drive the gear motors. If necessary, a separate DC-DC converter may be included in motor drive and logic circuit 620 to adjust the voltage to a proper level for driving the gearmotors.

As discussed above, motor drive and logic circuit 620 responds to inputs received from handle latch switches 614, insert button 615, and an extract button 617. In response, and in view of programmed logic, motor drive and logic circuit 620 provides drive currents 712 and 714 to gearmotors 610. In one embodiment, one or more connector pairs 716 and 718 are used to couple drive currents from board 702 to board carrier frame 110.

Under a typical implementation, gearmotors 610 will comprise DC motors, which employ brushes and are activated via DC current inputs via the brushes, as is well-known in the art. This is the simplest type of motor implementation. As an option, a brushless DC or AC motor may be used. Brushless DC and AC motors require more sophisticated controllers, and are generally more expensive than brush-type DC motors. However, the absence of brushes means that there are no brushes that might have to be replaced. Overall, motor drive and logic circuit 620 is illustrated of circuitry to drive a DC motor or a brushless DC or AC motor, as applicable.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A board insertion/extraction mechanism, comprising:
   first and second handles pivotally coupled to one of a board or a board carrier frame for the board at first and second pivot points, respectively, wherein the first and second handles each include a clasp for engaging a flange when the first and second handles are rotated; and
   a handle coupling mechanism, connected at a first end to the first handle and connected at a second end to the second handle,
      wherein the handle-coupling mechanism couples the motion of the first and second handles such that moving one of the handles causes the other handle to move in an opposing direction in a similar manner,
      wherein the handle-coupling mechanism comprises a bar linkage pivotally coupled at a first end to the first handle at a third pivot point offset from the first pivot point and pivotally coupled at a second end to the second handle at a fourth pivot point offset from the second pivot point,
      wherein the third and fourth pivot points fall on opposite sides of a line drawn between the first and second pivot points at some point in time during rotation of the first and second handles.

2. The board insertion/extraction mechanism of claim 1, wherein each of the first and second handles employs an over-center latch configuration.

3. The board insertion/extraction mechanism of claim 1, further comprising first and second retention screws, coupled to the board carrier frame.

4. The board insertion/extraction mechanism of claim 3, further comprising:
   first and second motors operatively coupled to the first and second retention screws, respectively; and
   a motor drive circuit, operatively coupled to activate each of the first and second motors.

5. The board insertion/extraction mechanism of claim 4, further comprising:
   first and second handle position detectors, to detect when the first and second handles are in a latched position; and
   a motor activation circuit, to enable activation of the first and second motors when both the first and second handles are detected in their latched positions.

6. The board insertion/extraction mechanism of claim 1, wherein each of the handles and the components of the handle-coupling mechanisms lie in a common plane.

7. The board insertion/extraction mechanism of claim 1, wherein the components making up the handles and the handle-coupling mechanisms are disposed between the board carrier frame and a printed circuit board corresponding to the board.

8. A board insertion/extraction mechanism comprising:
   first and second handles, each handle pivotally coupled to one of a board or a board carrier frame for the board; and
   a handle-coupling mechanism, connected at a first end to the first handle and connected at a second end to the second handle, wherein the handle-coupling mechanism couples the motion of the first and second handles such that moving one of the handles causes the other handle to move in a similar manner, wherein the handle-coupling mechanism comprises:
      first and second geared handles;
      a first pinion gear, operatively coupled to the first geared handle;
      an idler gear, operatively coupled to the second geared handle;
      a second pinion gear, operatively coupled to the idler gear, and
      a gear rack, having gear teeth operatively coupled to the first and second pinion gears.

9. The board insertion/extraction mechanism of claim 8, wherein the gear rack includes at least one slot, and a pin coupled to one of the board and the board carrier frame, wherein the pin and said at least one slot are configured to enable the gear to slide relative to the board or board carrier frame while maintaining engagement between the rack gear teeth and the first and second pinion gears.

10. A board insertion/extraction mechanism, comprising:
    first and second handles, each handle pivotally coupled to one of a board or a board carrier frame for the board; and
    a handle coupling mechanism, connected at a first end to the first handle and connected at a second end to the second handle, wherein the handle-coupling mechanism couples the motion of the first and second handles such that moving one of the handles causes the other handle to move in a similar manner, wherein the handle-coupling mechanism comprises:
       a first bar, having a first end pivotally coupled to the first handle and a second end;
       a second bar, having a first end pivotally coupled to the second handle and a second end pivotally coupled to the second end of the first bar at a common pivot; and
       a means for constraining the motion of the common pivot to a direction substantially perpendicular to an axis passing through pivot points for the first and second handles.

11. A board insertion/extraction mechanism of claim 10, wherein the means for constraining the motion of the common pivot comprises:
    a pin, operatively coupled to at least one of the first and second bars; and
    a slot formed in one of the board or the board carrier frame, the slot having a longitudinal axis substantially perpendicular to an axis passing through pivot points for the first and second handles.

12. A board insertion/extraction mechanism, comprising:
    first and second handles, each handle pivotally coupled to one of a board or a board carrier frame for the board; and
    a handle-coupling mechanism, connected at a first end to the first handle and connected at a second end to the second handle, wherein the handle-coupling mechanism couples the motion of the first and second handles such that moving one of the handles causes the other handle to move in a similar manner, wherein the handle-coupling mechanism comprises:
       a first telescopic member, having a first end pivotally coupled to the first handle and a second end; and
       a second telescopic member, having a first end pivotally coupled to the second handle and a second end, wherein the second ends of the first and second members are configured to telescopically engage one another.

13. The board insertion/extraction mechanism of claim 12, further comprising a means for maintaining a telescopic axis corresponding to the first and second telescopic members parallel with an axis passing though pivot points for the first and second handles.

14. The board insertion/extraction mechanism of claim 13, wherein the means for maintaining a telescopic axis corresponding to the first and second telescopic members parallel with the axis passing though pivot points for the first and second handles comprises;
   a pin, coupled to the first telescopic member; and
   an arcuate slot, formed in one of the board carrier frame or the board, the arcuate slot configured to guide the pin in an arc corresponding to an arc traversed by a pivot coupling the first telescopic member to the first handle when the first handle is rotated about its pivot.

15. A board insertion/extraction mechanism, comprising:
   first and second handles pivotally coupled to one of a board or a board carrier frame for a board at first and second pivot points, respectively, and configured to provide a latching function, the first and second handles each including a clasping means to engage a flange when the first and second handles are rotated; and
   means for coupling motion of the first and second handles such that moving one of the handles causes the other handle to move in an opposite direction, wherein the means for coupling motion is coupled at a first end to the first handle at a third pivot point offset from the first pivot point and coupled at a second end to the second handle at a fourth pivot point offset from the second pivot point, wherein the third and fourth pivot points fall on opposite sides of a line drawn between the first and second pivot points at some point in time during rotation of the first and second handles.

16. The board insertion/extraction mechanism of claim 15, wherein each of the first and second handles employs means for latching the handle.

17. The board insertion/extraction mechanism of claim 15, further comprising screw retention means, operatively coupled to the board carrier frame.

18. The board insertion/extraction mechanism of claim 17, further comprising:
   means for automatically inserting and extracting the screw retention means.

19. The board insertion/extraction mechanism of claim 15, further comprising:
   first and second handle position detector means, to detect when the first and second handles are in a latched position; and
   means for actuating the means for automatically inserting and extracting the screw retention means in response to handle position information obtained from the handle position detector means.

20. The board insertion/extraction mechanism of claim 15, wherein the components making up the handles and the means for coupling motion of the first and second handles are disposed between the board carrier frame and a printed circuit board corresponding to the board.

21. An Advance Telecommunications and Computing Architecture (ATCA) board, comprising:
   a printed circuit board (PCB) populated with a plurality of integrated circuits;
   a board carrier frame, to which the PCB is mounted;
   first and second handles, each handle pivotally coupled to the board carrier frame;
   first and second retention screws, coupled to the board carrier frame;
   first and second motors operatively coupled to the first and second retention screws, respectively;
   a motor drive circuit, operatively coupled to activate each of the first and second motors to insert and retract the first and second retention screws; and
   a handle-coupling mechanism, connected at a first end to the first handle and connected at a second end to the second handle,
   wherein the handle-coupling mechanism couples the motion of the first and second handles such that moving one of the handles causes the other handle to move in a similar manner.

22. The ATCA board of claim 21, further comprising:
   first and second handle position detectors, to detect when the first and second handles are in a latched position; and
   a motor activation circuit, to enable activation of the first and second motors when both the first and second handles are detected in their latched positions.

* * * * *